(12) United States Patent
Waite

(10) Patent No.: US 6,438,364 B1
(45) Date of Patent: Aug. 20, 2002

(54) RADIO FREQUENCY DEVICE WITH FAST CHARGING OF AN INPUT CAPACITANCE

(75) Inventor: Helen Margaret Waite, Sunnyvale, CA (US)

(73) Assignee: Philips Electronics North Americas Corporation, New York, NY (US)

(*) Notice: Subject to any disclaimer, the term of this patent is extended or adjusted under 35 U.S.C. 154(b) by 0 days.

(21) Appl. No.: 09/588,386

(22) Filed: Jun. 6, 2000

(51) Int. Cl.[7] .................................................. H04B 1/26
(52) U.S. Cl. ........................ 455/323; 455/326; 455/333
(58) Field of Search ................................. 455/323, 326, 455/330, 333, 355, 318; 357/355, 357, 359; 320/166, 167

(56) References Cited

U.S. PATENT DOCUMENTS 5,438,693 A * 8/1995 Cox ............................ 455/333
6,064,327 A * 5/2000 Ryoho ......................... 341/154
6,204,654 B1 * 3/2001 Miranda ...................... 323/316
6,215,291 B1 * 4/2001 Mercer ........................ 323/313

OTHER PUBLICATIONS

By Philips Semiconductors Data Sheet SA2421 2.45 GHz Low Voltage RF Transceiver; Mar. 13, 2000 pp. 1–12. (Product Specification Supersedes Data of Feb. 11, 2000).

* cited by examiner

Primary Examiner—Vivian Chin
Assistant Examiner—John J. Lee

(57) ABSTRACT

A radio frequency device has an input transistor from which a capacitance is seen, and a fast charging circuit for charging the capacitance. The input transistor receives a radio frequency signal. The capacitance is quickly charged when the device is switched from off to on and/or from low gain to high gain, thereby reducing the switching-on time of the device.

8 Claims, 4 Drawing Sheets

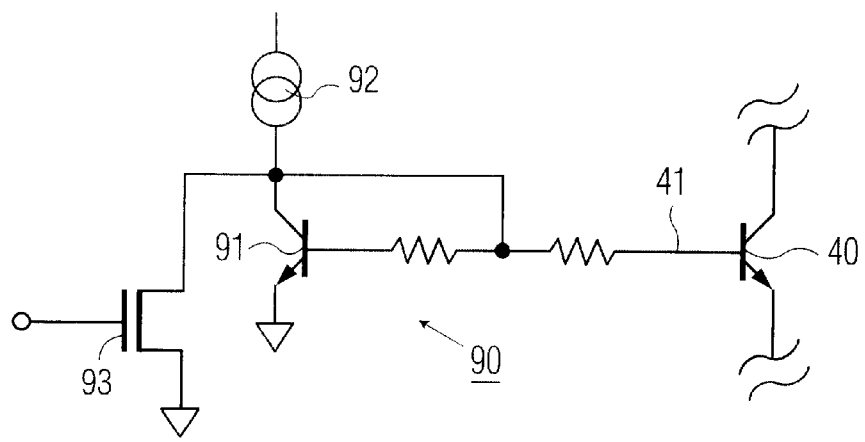
FIG. 6
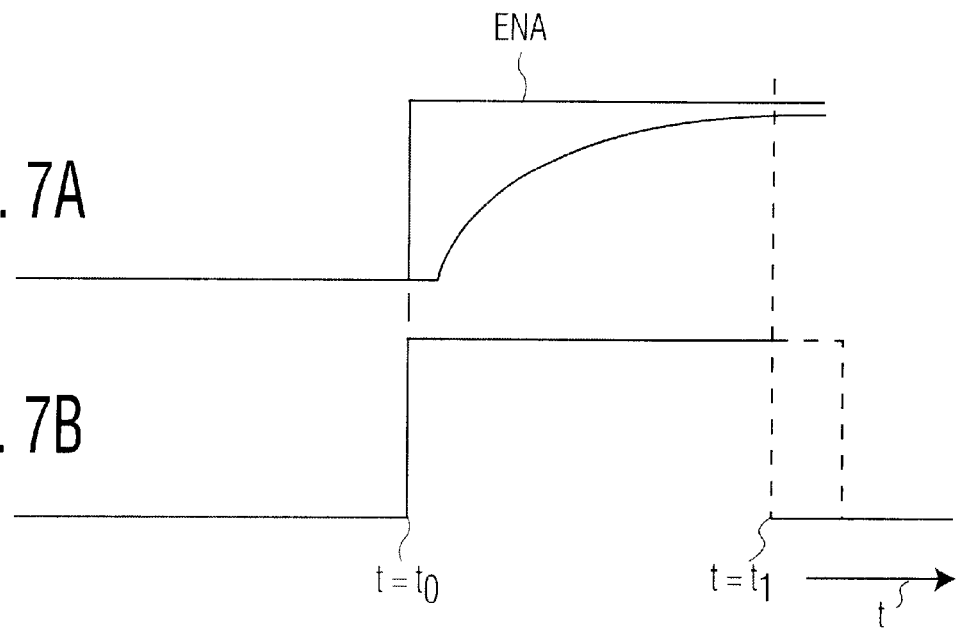
FIG. 7A
FIG. 7B

RADIO FREQUENCY DEVICE WITH FAST CHARGING OF AN INPUT CAPACITANCE

BACKGROUND OF THE INVENTION

1. Field of the Invention

The present invention relates to a radio frequency device, more particularly to a radio frequency device that has an input transistor that sees a capacitance that needs to be charged when the radio frequency device is switched from off to on, and/or to a higher gain mode. Such a radio frequency device can be a low noise amplifier, a mixer, or any other suitable radio frequency device. The radio frequency device is used in a receiver, a transmitter, or transceiver, or the like.

2. Description of the Related Art

Gain-mode switchable devices such as low noise radio frequency amplifiers are known. Such devices have at least two switchable gain paths, a high gain path and a low gain path. Particularly in such systems as CDMA mobile radio systems, but also in many other systems, low noise radio frequency amplifiers should be highly linear. A key parameter to express linearity is the so-called Input Third Order Intercept Point (IIP3) of the amplifier. This is a measure for the third order distortion of the amplifier. The IIP3-point is defined as the point where the linearly extrapolated fundamental frequency characteristic of the amplifier intercepts the third order characteristic of the amplifier, i.e., has the same output power at the same input power, when two tones of a different frequency are applied to the input of the amplifier, i.e., when so-called Δf modulation is applied. In a typical CDMA application the radio frequency is 2 GHz and the test tones differ 1 MHz. CDMA systems such as in the USA, share their frequency band with the so-called AMPS system. Under such circumstances, the IIP3 parameter becomes a critical radio frequency parameter because large AMPS signals in the neighborhood of a wanted CDMA signal could work as blocking signals when the low noise amplifier is not sufficiently linear. One measure to extend a linearity range of a low noise radio frequency amplifier is to degenerate an emitter path of an input transistor of the low noise radio frequency amplifier by putting resistance and/or inductance between the emitter of the transistor and an output pin of an integrated circuit embodying the radio frequency device. Other key parameters of the amplifier are its gain and noise figure. In this respect, a better linearity has a degrading effect on the noise figure so that a trade-off has to be made. In order to improve linearity of the low noise radio frequency amplifier, a capacitor to ground, that is large for the application, is preferably connected to the input electrode of the input transistor. Such a large capacitor is typically in a range of 100 pF to 20 nF and forms a low impedance at the Δf modulation. The input electrode of the input electrode is typically coupled to a matching network, such as a 50Ω matching network, via a DC-blocking capacitor. In addition thereto, parasitic capacitance is present at the input electrode of the input transistor. The low noise radio frequency amplifier is switchable from a low gain where the voltage at the input electrode is close to zero volts to a high gain mode where the voltage at the input electrode is finite. Low/high gain mode can be implemented by providing a cascode transistor arrangement wherein the input transistor is configured as a common emitter amplifier that is switched on in the high gain mode, and off when the amplifier is in the low gain mode. In low gain mode an alternative low gain path would be active. Proper biasing of the input transistor causes the input transistor to turn off. Such a cascode transistor arrangement is applied in an Integrated Circuit of type SA2421. Such a mode-switching is important when using the radio frequency device in portable transceivers like mobile radio handsets, so as to increase the stand-by time of the transceiver. In order not to loose data, it is important that a so-called switching time to switch the low noise radio frequency amplifier from a low to a high gain is small. The application of a large capacitance at the input electrode of the input transistor tends to increase the switching time because it takes too long for the large capacitor to charge it to the required turn on voltage, such a charging occurring 'naturally' through the biasing.

SUMMARY OF THE INVENTION

It is an object of the invention to provide a highly linear gain-mode switchable radio frequency device that has a short switching on time when being switched from a low gain to a high gain mode.

It is another object of the invention to provide a single gain mode radio frequency device that has a short switching on time when being switched from off to on.

It is another object of the invention to provide such a radio frequency device wherein the input noise figure is hardly affected.

It is still another object of the invention to provide a radio frequency device with an automatic input capacitance charging shut-off mechanism.

In accordance with the invention, a radio frequency device is provided, said radio frequency device comprising:

an input transistor comprising an input electrode from which a capacitance is seen, said input transistor being switchable between an on-mode and an off-mode, and said input electrode receiving a radio frequency signal; and a charging circuit for charging said capacitance when said input transistor is switched from said off-mode to said on-mode.

In an embodiment, the radio frequency device further comprises gain mode switching means for switching said radio frequency device into at least a first gain mode and a second gain mode, in said first gain mode said radio frequency device having a lower gain than in said second gain mode, said input transistor being coupled to said gain mode switching means, and said gain mode switching means switching said radio frequency device from said first into said second gain mode when said input transistor is switched from said off-mode to said on-mode.

The invention is based on the insight that, by not relying on natural charging through biasing alone of the input transistor, when being switched from off to on, and/or from a low to a high gain mode, but by providing a charge boost to charge the input capacitance seen by the input transistor, the switching time can be greatly reduced.

In a very advantageous embodiment of the invention, the quantity or variable defining switching off of the charging boost mechanism is a quantity not measured at the input electrode of the input transistor but a quantity at another node. Herewith, the input noise figure of the radio frequency device is minimally affected. Such a quantity can be a current flowing through a resonance suppression resistor in series with a bond wire through which DC power is provided to the radio frequency device. When the radio frequency device switches to the on-mode and/or to the high gain mode, after the input capacitance has been charged to a sufficient level the input transistor carries a current that is detectable at the output of the radio frequency device. Such detection is used to automatically shut-off charging.

In an advantageous embodiment of the invention, a high charging current is obtained through current amplification via a charging transistor. In order to minimize a load effect on the input transistor, the charging transistor is fully shut-off once charging of the capacitance is completed. Herewith, the charging process imposes minimal impact upon the input noise figure of the radio frequency device.

BRIEF DESCRIPTION OF THE DRAWING

FIG. 6 shows a biasing circuit in a radio frequency device according to the invention.

FIG. 7 shows a timing diagram to illustrate switching of a radio frequency device according to the invention, from a low gain mode to a high gain mode.

Throughout the figures the same reference numerals are used for the same features.

DESCRIPTION OF THE DETAILED EMBODIMENTS

Figure 1:
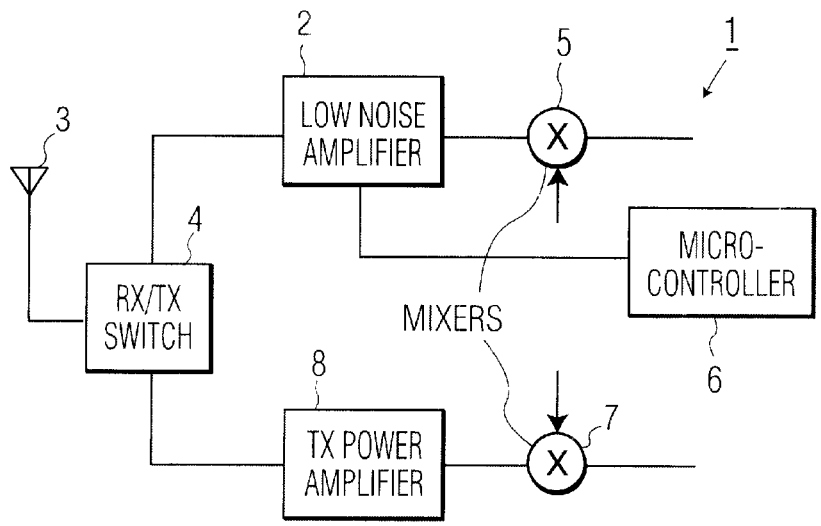
FIG. 1 is a block diagram of a transceiver comprising a radio frequency device according to the invention.

FIG. 1 is a block diagram of a transceiver 1 comprising a low noise amplifier 2 that is coupled, at input side, to an antenna 3 via a receive/transmit switch 4, and, at output side to a mixer of frequency down-converter 5. The transceiver further comprises a microcontroller 6 for controlling gain-mode switching and/or off to on switching of the low noise amplifier 2, a transmit mixer 7, and a transmit power amplifier 8. The invention is embodied in the low noise amplifier 2, but may be embodied in any other suitable radio frequency device, such as the mixer 5.

Figure 2:
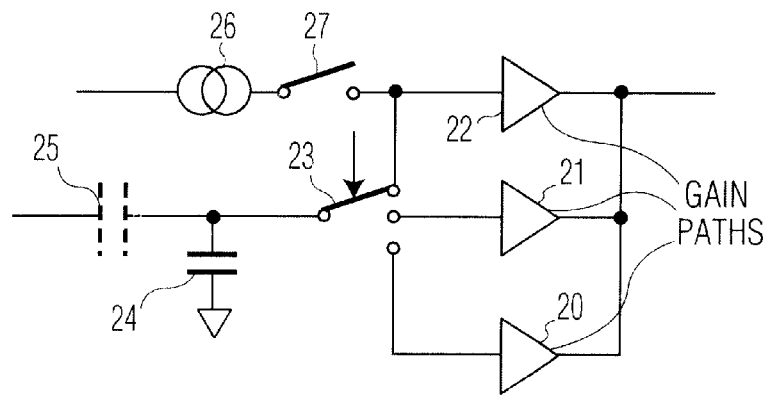
FIG. 2 schematically shows a gain path configuration of an embodiment of a radio frequency device according to the invention.

FIG. 2 schematically shows a gain path configuration of an embodiment of the low noise amplifier 2 as a radio frequency device according to the invention. The low noise amplifier 2 comprises three separate gain paths, a low gain path 20, a medium gain path 21, and a high gain path 22. The gain paths 20–22 are switchable by a controllable switch 23. At its input, the low noise amplifier 2 sees a capacitance, which may be a for radio frequencies large capacitor 24 to ground, and/or a DC-blocking capacitor 25 that is coupled to an impedance matching circuit (not shown), and/or parasitic capacitance. An inductor (not shown) may be arranged in series with the large capacitor 24 so that the matching circuit at radio frequency is substantially unaffected by the large capacitor 24. The large capacitor 24 may be comprised in the matching circuit. In accordance with the invention, when a finite voltage is present at the input of the low noise amplifier 2, defined by biasing, the high gain path 22 is switched on and the capacitance seen at the amplifier's input is quickly charged by a charging current source 26 that is applied in addition to biasing and that is enabled by a switch 27. In the embodiment given, a zero voltage or floating signal is present at the amplifier's input when the low and medium gain paths 20 and 21 are active.

Figure 3:
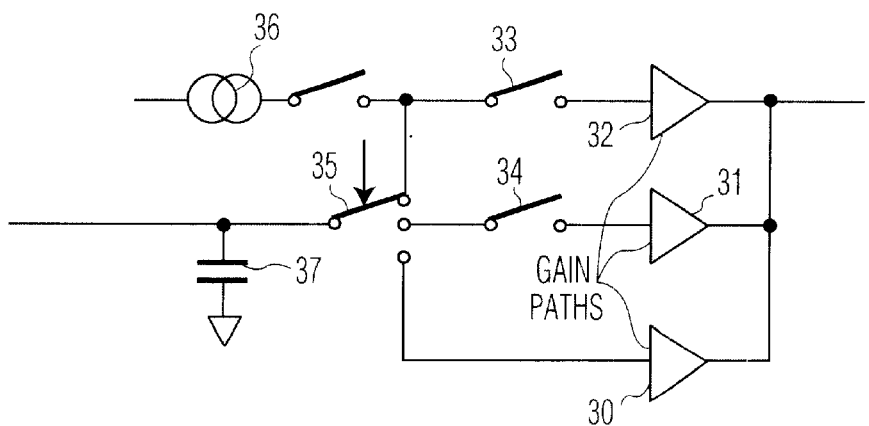
FIG. 3 schematically shows another gain path configuration of an embodiment of a radio frequency device according to the invention.

FIG. 3 schematically shows another gain path configuration of another embodiment of the low noise amplifier 2 as a radio frequency device according to the invention. In this configuration, a finite voltage is present at the amplifier's input when the medium and high gain paths are active, and it is then determined by respective switches 33, 34, and 35 which one of the medium and high gain paths 31 and 32 is currently active, a charging current source 36 then quickly charging a capacitor 37 at the amplifier's input.

Instead of the shown three gain modes in FIGS. 2 and 3, the low noise amplifier 2 may have two gain modes only.

Figure 4:
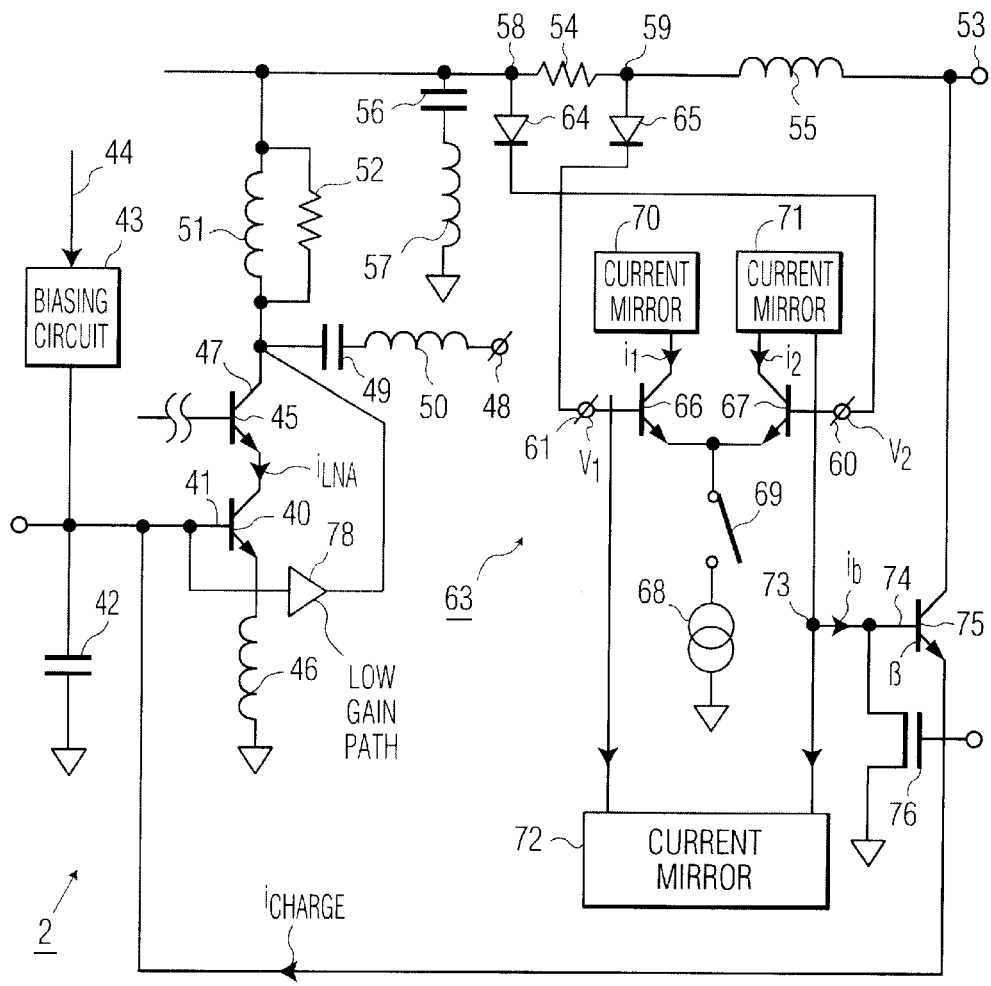
FIG. 4 shows a detailed embodiment of a radio frequency device according to the invention, embodied as a low noise radio frequency amplifier.

FIG. 4 shows a detailed embodiment of a radio frequency device according to the invention, embodied as the low noise radio frequency amplifier 2. The amplifier 2 comprises an input transistor 40 with an input electrode 41 that is coupled to a for radio frequencies large capacitor 42 and to a biasing circuit 43. The large capacitor 42 typically has a value in a range of 100 pF to 20 nF. A control input 44 determines whether the low noise radio frequency amplifier 2 has a finite voltage at the input electrode 41 defining a high gain mode, or a zero or floating voltage at the input electrode 41 defining a low gain mode. The finite voltage that builds up on the capacitor 42 when being quickly charged turns on the input transistor 40. In the low gain mode, the input transistor 40 is switched off. The input transistor 40 is switched in a cascode transistor configuration with a further transistor 45. The input transistor 40 is configured as a common emitter amplifier with a bond wire inductance 46 in it's emitter lead to ground, possibly via a small resistor (not shown), thereby providing a degeneration effect that extends the linear range of the input/output voltage characteristic of the input transistor 40. An output electrode 47 of the further transistor 45 is coupled to an output pin 48 via a capacitor 49 and a bond wire inductance 50, and to a load formed by a parallel arrangement of an inductor 51 and a resistor 52. At another end the load is coupled to a supply terminal 53 via a small resistor 54 and a bond wire inductance 55, and further via a series arrangement of a capacitor 56 and a bond wire inductance 57 to a ground terminal. The series arrangement is at resonance at radio frequencies, and the resonance that could occur from the bond wire 55 in parallel with the capacitor 56 and the bond wire 57 is damped by the small resistor 54. In a preferred embodiment of the invention, at nodes 58 and 59 it is differentially sensed whether the low noise amplifier is switched on after a finite voltage builds up at another node than at the input electrode 41 after enabling quick charging of the capacitor 42. Upon building up of the turn on voltage at the input electrode 41, the input transistor 40 is turned on if the turn on voltage is above a given base-emitter voltage of the input transistor 40 that causes the input transistor 40 to become conductive. Typically, the input transistor 40 becomes fully conductive if the turn on voltage is between 0.8 and 0.9 Volts. Then, a current $i_{LNA}$ flows through the cascode arrangement. The current $i_{LNA}$ also flows through the resistor 54. Thereby, the resistor 54 senses whether or not the input transistor 40 becomes conductive, after switching the low noise radio frequency amplifier 2 from a low to a high gain mode. The nodes 58 and 59 are respectively coupled to input terminals 60 and 61 of a charging circuit 63 via respective diodes 64 and 65. The charging circuit 63 quickly charges the capacitor 42 when the low noise radio frequency amplifier is switched from the low to the high gain mode. The charging circuit 63 comprises a differential pair of transistors 66 and 67 on which respective input electrodes are coupled to the input terminals 61 and 60. A current source 68, that can be switched off to save power by a controllable switch 69, is coupled to emitters of the transistors 66 and 67. Respective currents in the transistors 66 and 67 are mirrored by ratioed current mirrors 70 and 71. The mirrored current in the current mirror 70 is mirrored into a ratioed current mirror 72. The mirrored current of the current mirror 71 and the mirrored current of the current mirror 71 are algebraically added at a current node 73. An input electrode 74 of a current amplifying charging transistor 75 for charging the capacitor 42 is coupled to the current node 73. A MOS transistor 76 is provided for switching off the charging transistor 75 at an instant that is it sure that the capacitor is fully or at least substantially charged so that charging circuit 63 stops charging the capacitor 42. The operation of the fast charging circuit 63 is as follows. When the switch 69 is closed and the switch 76 is open, as long as $i_{LNA}=0$, respective voltages $V_1$ and $V_2$ at the terminals 61 and 62 are equal, and thus main currents $i_1$ and $i_2$ in the transistors 66 and 67. Then, with a current ratio of 5:1 of the ratioed current mirrors 70–72, a base current $i_b=0.8i_2=0.8i_1$ flows into the charging transistor 75. Other ratios may be applied as well. The charging transistor 75 amplifies the base current $i_b$ by its current amplification factor □ thereby providing a charging current $i_{CHARGE}$ that quickly charges the capacitor 42. After the built-up turn on voltage at the input electrode 41 switches on the input transistor 40 so that $i_{LNA}$□0, because of a thereby caused voltage drop at the resistor 54, $V_1$□$V_2$. This causes $i_1>>i_2$ so that the current mirror 72 sinks all current and $i_b=0$. Herewith $i_{CHARGE}=0$ and charging of the capacitor 42 automatically stops. In order to minimize a loading effect of the charging circuit 63 at the input of the low noise radio frequency amplifier 2, the transistor 76 is thereafter controlled to fully switch off the charging transistor 75 and the switch 69 is opened to reduce power. When needed, the charging circuit 63 is enabled again by reconnecting the current source 68 and by switching off the transistor 76. The low noise radio frequency amplifier 2 further comprises a low gain path 78 that is active in the low gain mode.

Figure 5:
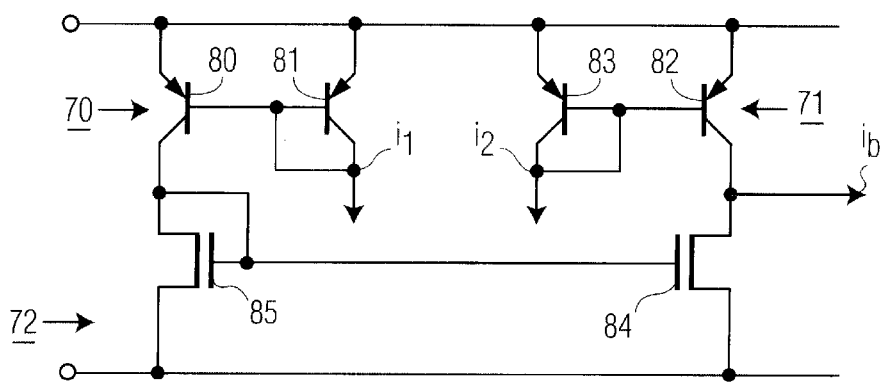
FIG. 5 shows a current mirror configuration in radio frequency device according to the invention.

FIG. 5 shows a current mirror configuration of the current mirrors 70–72 in radio frequency device according to the invention. The current mirror 70 is comprised of bipolar transistors 80 and 81, the current mirror 71 is comprised of bipolar transistors 82 and 83, and the current mirror 72 is comprised of MOS transistors 84 and 85. Any other suitable configuration of MOS and bipolar transistors may be applied.

FIG. 6 shows a biasing circuit 90 in a radio frequency device according to the invention. The circuit 90 comprises current mirror transistor 91 that is coupled to a bias current source 92. By switching on or off a MOS transistor 93 that is also coupled to the bias current source 92, a bias current is diverted to the MOS transistor 93 or provided to the input transistor 40. The bias current is diverted to the MOS transistor 93 when the low noise radio frequency amplifier is in its low gain mode.

FIG. 7 shows a timing diagram to illustrate switching of a radio frequency device according to the invention, from a low gain mode to a high gain mode. Upon switching the low noise radio frequency amplifier 2 from a low gain mode to a high gain mode, at an instant $t=t_0$, an enable signal ENA is provided to the MOS transistor 76 and the switch 69 thereby enabling charging of the capacitor 42. At an instant $t=t_1$, the capacitor is fully or at least substantially charged and charging of the capacitor 42 automatically stops. At an instant thereafter, as indicated by dashes lines, the MOS transistor 76 and the switch 69 are controlled to completely switch off the charging transistor 75 so that the charging circuit has a minimal impact on the input noise figure of the amplifier 2 when in the high gain mode. Simulation results have shown, as compared to a low noise amplifier without a fast charging circuit as of the invention, that fast charging greatly reduces the switching-on time of the amplifier 2. Typically, with a total capacitance seen by the input transistor 40 in the order of 200 pF, the switching on time was reduced from 1400 ns to 184 ns, a great reduction.

Figure 8:
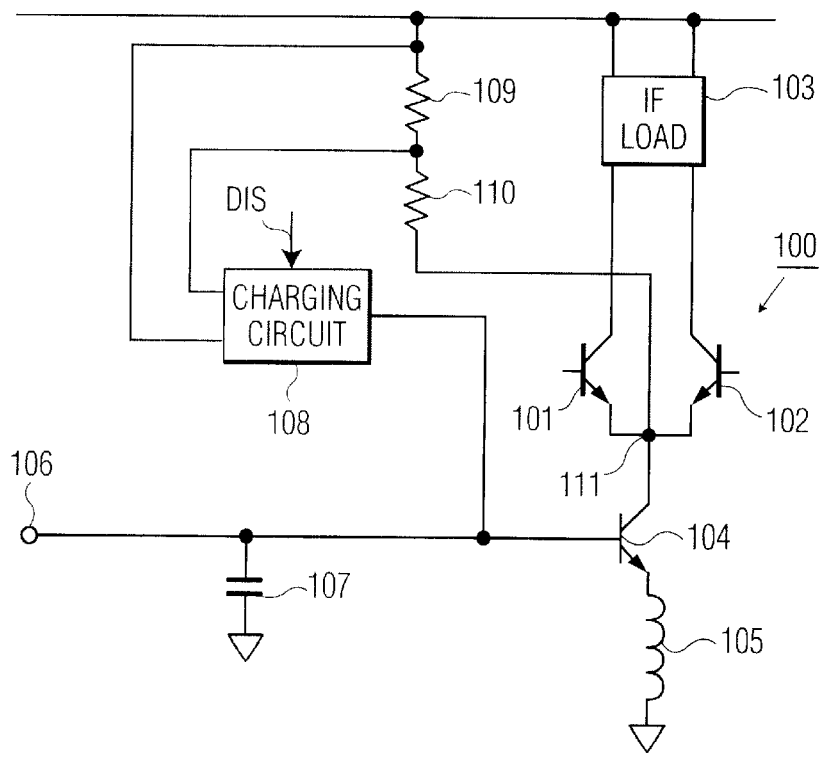
FIG. 8 shows an embodiment of a radio frequency device according to the invention, embodied as a mixer.

FIG. 8 shows an embodiment of a radio frequency device according to the invention, embodied as a mixer 100. The mixer 100 comprises a differential pair of transistors 101 and 102 of which inputs are differentially coupled to a local oscillator (not shown) and of which outputs are coupled to an intermediate frequency (IF) load 103. An input transistor 104 of the mixer 100 has its emitter coupled to ground via a bond wire inductance 105 and has its base coupled to an input node 106. The input transistor 104 sees a capacitance, in the example given a capacitor 107 to ground. A fast charging circuit, preferably of the type shown in FIG. 4 has its output coupled to the input node 106, and its sensing inputs coupled to bleed resistors 109 and 110. The series arranged bleed resistors 109 and 110 are further coupled to a node 111 of the mixer 100. When charging of the capacitor 107 is enabled, and the voltages at the sensing inputs are equal because the mixer has not been switched on yet, a charging current flows. Once a nominal current flows through the bleed resistors 109 and 110, charging automatically stops. During normal operation of the mixer 100, the charging circuit 108 is disabled by a disable signal DIS.

Figure 9:
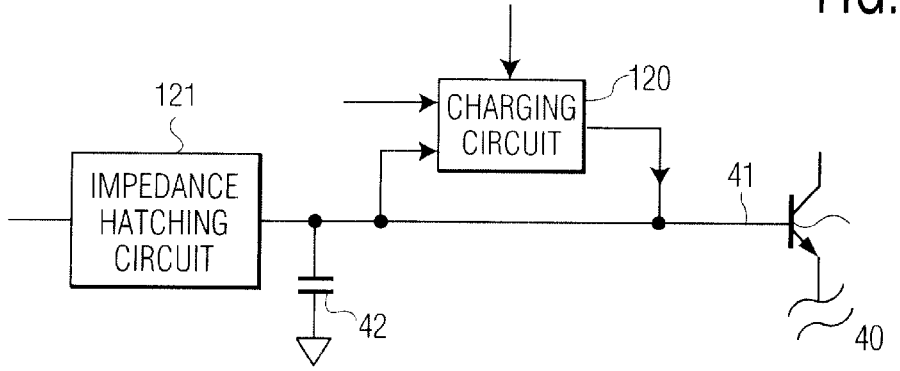
FIG. 9 shows another embodiment of a radio frequency device according to the invention.

FIG. 9 shows another embodiment of a radio frequency device according to the invention, with a charging circuit 120. The input node 41 is further coupled to an impedance matching circuit 121. Instead of sensing a node other than the input node, in this embodiment the input node 41 is sensed. The charging circuit 120 can be similar to the charging circuit as shown in FIG. 4 or any other suitable fast charging circuit.

Figure 10:
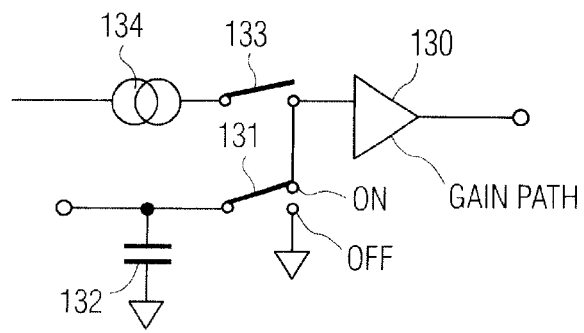
FIG. 10 shows an embodiment of a radio frequency device according to the invention in which the radio frequency device is a single gain mode device.

FIG. 10 shows an embodiment of a radio frequency device according to the invention in which the radio frequency device is a single gain mode device. The single gain mode device comprises a single gain path 130 that is switchable between an on and an off mode by a controllable switch 131. When switched on, the gain path 130 sees a large capacitor 132 at its rf-input. At the same time, through a controllable switch 133, a charging current source 134 is switched to the large capacitor 132 to quickly charge the capacitor 132. In an embodiment of the single gain mode radio frequency device, the circuit basically is the same as the circuit shown in FIG. 4, but without the low gain path 78.

In view of the foregoing it will be evident to a person skilled in the art that various modifications may be made within the spirit and the scope of the invention as hereinafter defined by the appended claims and that the invention is thus not limited to the examples provided. The word "comprising" does not exclude the presence of other elements or steps than those listed in a claim.

What is claimed is:

1. A radio frequency device comprising:
    an input transistor comprising an input electrode from which a capacitance is seen, said input transistor being switchable between an on-mode and an off-mode, and said input electrode receiving a radio frequency signal; and a charging circuit for charging said capacitance when said input transistor is switched from said off-mode to said on-mode, said charging circuit comprising:

a differential amplifier with differential inputs and a current sensing resister connected across the differential inputs to detect a quantity of current flowing across the input transistor and to cause said charging to automatically cease if said quantity has changed from a first value to a second value, said second value occurring when said capacitance is fully charged;

a first current mirror for mirroring a first output current at a first output of said differential amplifier;

a second current mirror for mirroring a second output current of said differential amplifier;

a third current mirror that is coupled to said first and second current mirrors, said second current mirror providing a charging current upon initiation of said charging, and said third mirror fully sinking said charging current if said quantity has adopted said second value; and a charging transistor of which an input electrode receives said charging current, and an output electrode provides a current amplified charging current, said current amplified charging current charging said capacitance.

2. A radio frequency device as claimed in claim 1, further comprising gain mode switching means for switching said radio frequency device into at least a first gain mode and a second gain mode, in said first gain mode said radio frequency device having a lower gain than in said second gain mode, said input transistor being coupled to said gain mode switching means, and said gain mode switching means switching said radio frequency device from said first into said second gain mode when said input transistor is switched from said off-mode to said on-mode.

3. A radio frequency device as claimed in claim 1, wherein said charging circuit comprises an enable input for enabling said charging circuit.

4. A radio frequency device as claimed in claim 3, wherein said charging circuit comprises a transistor switch coupled to said input electrode of said charging transistor, said transistor switch being controlled to switch off said charging transistor after said capacitance is fully charged.

5. A radio frequency device as claimed in claim 1, said radio frequency device being a low noise amplifier, said radio frequency device further comprising a cascode transistor configured into a cascade circuit configuration with said input transistor.

6. A radio frequency device as claimed in claim 1, said radio frequency device being a mixer, said radio device further comprising a differential pair to inputs of which local oscillator signals are provided, main current paths of said differential pair being configured between a intermediate frequency load and an output electrode of said input transistor.

7. A radio frequency device as claimed in claim 6, wherein said charging circuit is configured to sense a quantity at a node formed by said differential pair and said input transistor.

8. A radio frequency device as claimed in claim 7, wherein said radio frequency device comprises a current sensing resistor coupled to said node.

* * * * *